US008345442B2

(12) United States Patent
Chen et al.

(10) Patent No.: US 8,345,442 B2
(45) Date of Patent: Jan. 1, 2013

(54) LATCHING STRUCTURE OF ELECTRONIC DEVICE

(75) Inventors: Kuan-Hung Chen, Shindian (TW); Yao Wang, Shenzhen (CN); Wen-Yi Yin, Shenzhen (CN)

(73) Assignees: Shenzhen Futaihong Precision Industry Co., Ltd., Shenzhen (CN); FIH (Hong Kong) Limited, Kowloon (HK)

( * ) Notice: Subject to any disclaimer, the term of this patent is extended or adjusted under 35 U.S.C. 154(b) by 238 days.

(21) Appl. No.: 12/889,614

(22) Filed: Sep. 24, 2010

(65) Prior Publication Data

US 2012/0026701 A1 Feb. 2, 2012

(30) Foreign Application Priority Data

Jul. 28, 2010 (CN) .......................... 2010 1 0239236

(51) Int. Cl.
*H05K 1/11* (2006.01)
*H05K 1/14* (2006.01)
(52) U.S. Cl. .................. 361/801; 361/803; 361/807
(58) Field of Classification Search .................. 361/728, 361/730, 752, 796, 800–803, 807, 809, 810; 174/138 E, 138 G
See application file for complete search history.

(56) References Cited

U.S. PATENT DOCUMENTS

| 5,144,533 | A * | 9/1992 | Annett | 361/740 |
| 6,233,153 | B1 * | 5/2001 | Baur et al. | 361/752 |
| 6,449,156 | B1 * | 9/2002 | Han et al. | 361/704 |
| 6,728,112 | B1 * | 4/2004 | Qin et al. | 361/759 |
| 7,089,646 | B2 * | 8/2006 | Leerkamp et al. | 29/592.1 |
| 7,259,969 | B2 * | 8/2007 | Zarganis et al. | 361/800 |
| 7,358,438 | B2 * | 4/2008 | Zoller | 174/50 |
| 7,517,231 | B2 * | 4/2009 | Hiew et al. | 439/76.1 |
| 8,023,284 | B2 * | 9/2011 | Sung et al. | 361/807 |
| 8,184,438 | B2 * | 5/2012 | Kaneko et al. | 361/705 |

* cited by examiner

*Primary Examiner* — Hung S Bui
(74) *Attorney, Agent, or Firm* — Altis Law Group, Inc.

(57) ABSTRACT

A latching structure of electronic device includes a lower housing, a circuit board and an upper housing. The lower housing forms at least one fixing pole; The circuit board defines at least one positioning slot corresponding to the fixing pole; The upper housing defines at least one engaging hole corresponding to the fixing pole. The fixing pole, passes through the positioning slot and the engaging hole, and the distal end of the fixing pole becomes liquefied, secures the lower housing with the circuit board and the upper housing, the circuit board is clamped between the lower housing and the upper housing.

13 Claims, 4 Drawing Sheets

LATCHING STRUCTURE OF ELECTRONIC DEVICE

BACKGROUND

1. Technical Field

The present disclosure relates to latching structures of electronic device.

2. Description of Related Art

It is typical to screw a metal plate and a circuit board into a housing by bolts. However, the bolts may loosen relative to the housing over time.

Therefore, there is room for improvement within the art.

BRIEF DESCRIPTION OF THE DRAWINGS

Many aspects of the present latching structure of electronic device can be better understood with reference to the following drawings. The components in the various drawings are not necessarily drawn to scale, the emphasis instead being placed upon clearly illustrating the principles of the present disclosure. Moreover, in the drawings, like reference numerals designate corresponding parts throughout the diagrams.

DETAILED DESCRIPTION

The disclosed latching structure can be applied in electronic device, such as a mobile phone or personal digital assistant.

Figure 1:
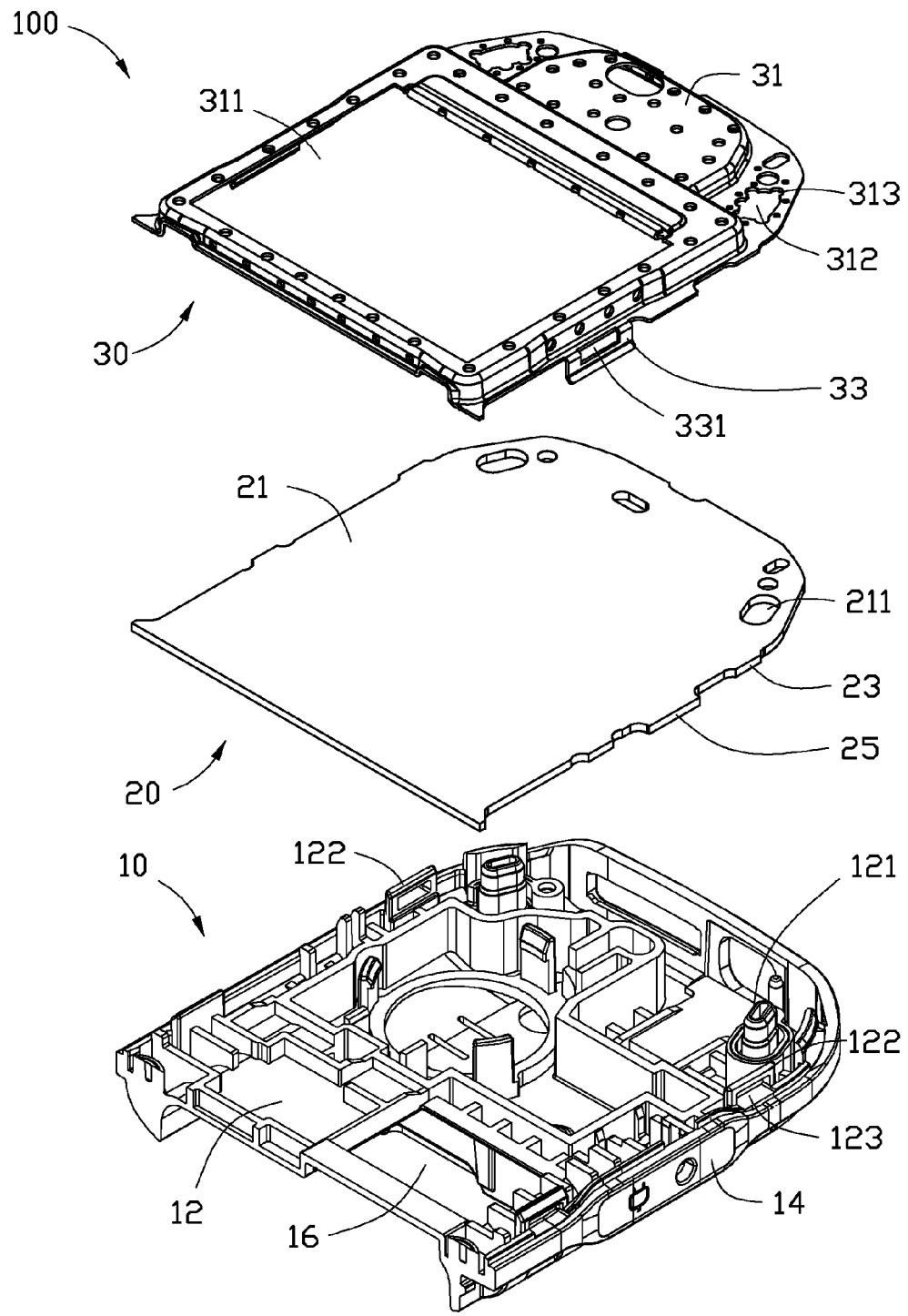
FIG. 1 is an exploded schematic view of a latching structure of electronic device according to a exemplary embodiment.

FIG. 1 shows the latching structure 100 including a lower housing 10, a circuit board 20, and an upper housing 30. The circuit board 20 and the upper housing 30 are secured to the lower housing 10, and the circuit board 20 is clamped between the lower housing 10 and the upper housing 30.

The lower housing 10 may be made of plastic and includes a bottom wall 12, a peripheral wall 14 surrounding the bottom wall 12 to form a receiving chamber 16. A number of fixing poles 121 and latching blocks 122 protrude from the bottom wall 12. Each fixing pole 121 may be made of plastic and may be melted and cooled to hold components together in assembly processes. The two fixing poles 121 are located at two opposite corners of the bottom wall 12. The fixing pole 121 can secure the lower housing 10 to the circuit board 20 and the upper housing 30. The two latching blocks 122 are located adjacent to two opposite flanges of the bottom wall 12. Each latching block 122 defines a locking slot 123 to engage with the circuit board 20. The latching blocks 122 can be biased towards the bottom wall 12 under an external and lateral force.

The circuit board 20 can be assembled in the receiving chamber 16. The circuit board 20 includes a base 21, two opposite extending flanges 23, and two opposite latching flanges 25. The base 21 defines two positioning slots 211 for passing over the two fixing poles 121. Each extending flange 23 and the corresponding latching flange 25 on the same side of the base 21 are spaced and laterally extended along the side of the base 21. When the circuit board 20 is received in the receiving chamber 16, the extending flanges 23 engage into the locking slots 123 to secure the circuit board 20 to the lower housing 10.

The upper housing 30 can be made of metal. The upper housing 30 includes a main body 31 and two folding flanges 33. The two folding flanges 33 are oppositely and perpendicularly formed at two sides of the main body 31. The main body 31 corresponds to the circuit board 20 in shape and size and can overlay the circuit board 20. The upper housing 30 forms a frame 311 to assemble components such as a display module (not shown) for the electronic device. The upper housing 30 defines two engaging holes 312 corresponding to the two positioning slots 211. The two fixing poles 121 can pass through the two engaging holes 312. Conjoining holes 313 are defined at the periphery of each engaging hole 312 and communicate with the engaging hole 312. Each folding flange 33 defines a latching hole 331 to receive the latching flange 25 to secure the upper housing 30 with the circuit board 20.

Figure 2:
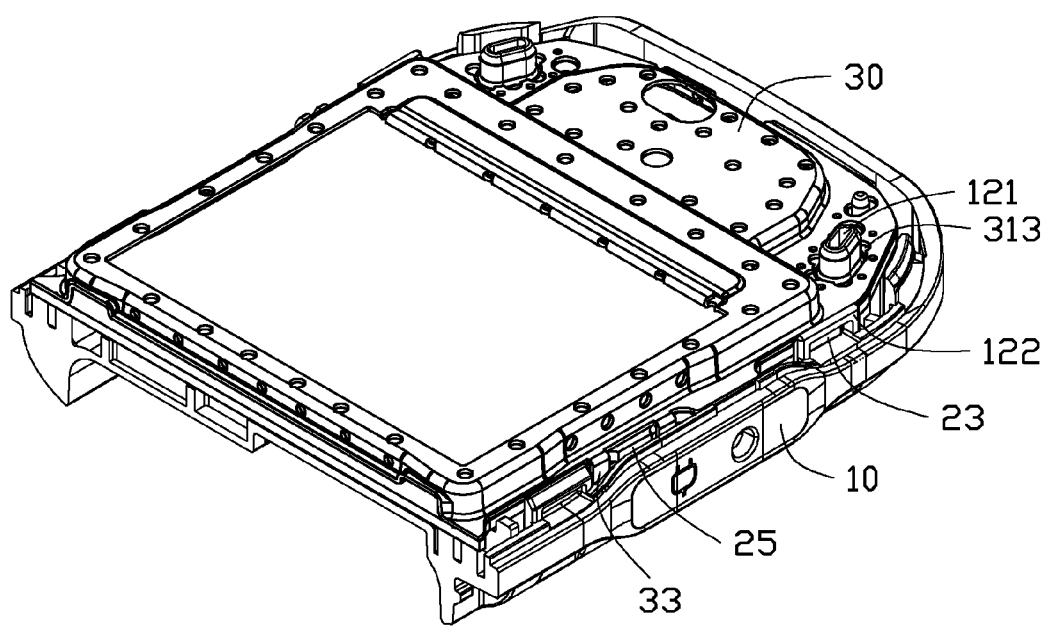
FIG. 2 is an assembled schematic view of the latching structure of electronic device shown in FIG. 1 before melting and cooling the fixing pole.
Figure 3:
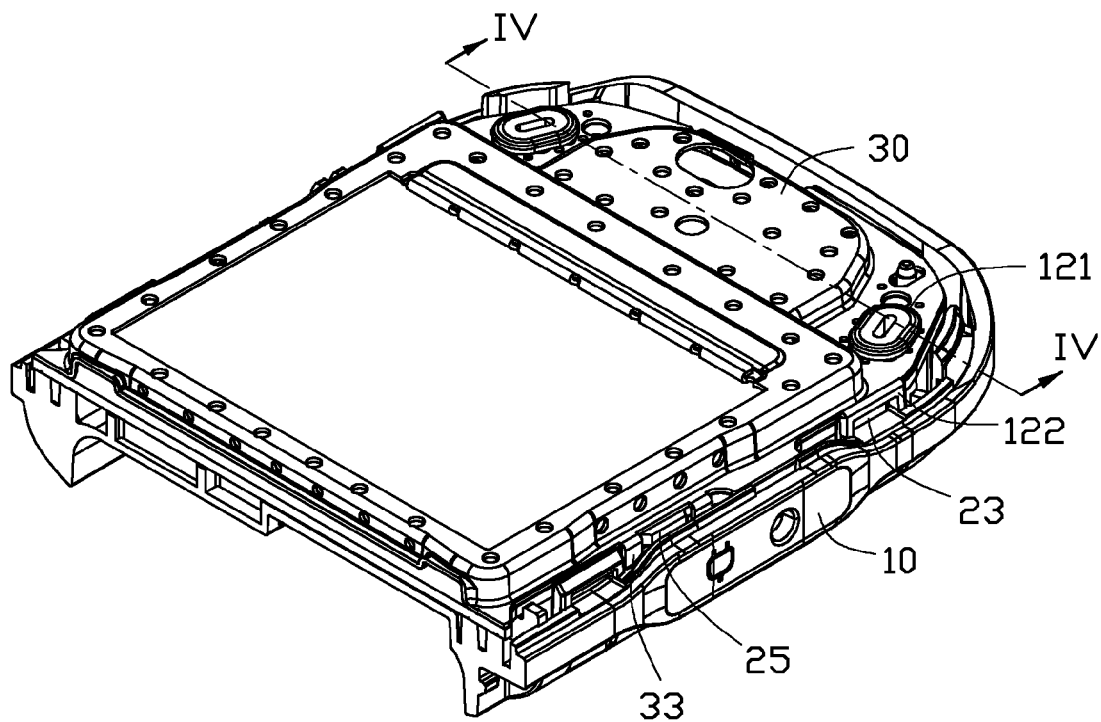
FIG. 3 is an assembled schematic view of the latching structure of electronic device shown in FIG. 1 after melting and cooling the fixing pole.
Figure 4:
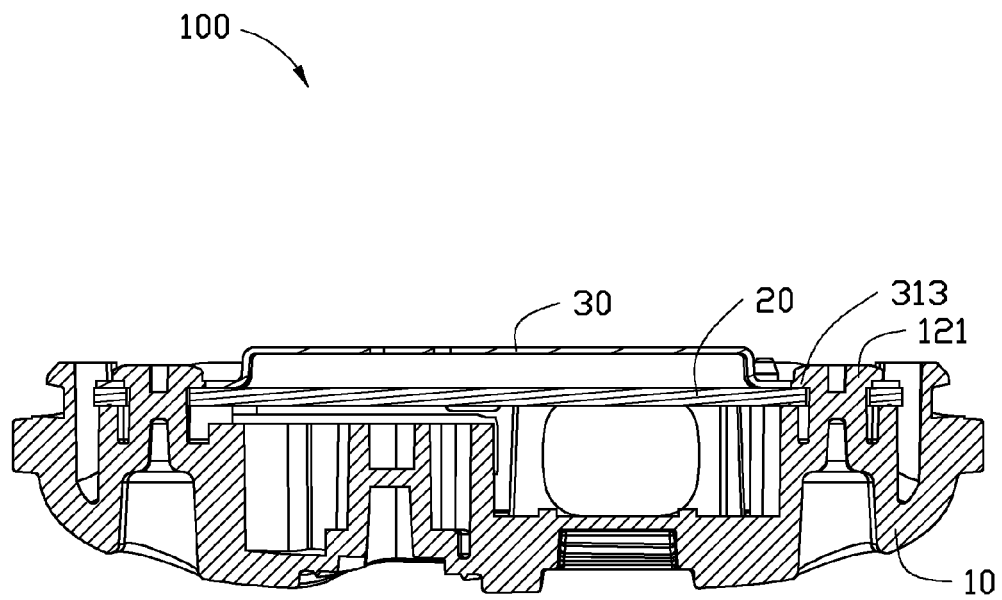
FIG. 4 is a cross-section view of the assembled latching structure of electronic device shown in FIG. 3.

Referring to FIG. 2 and FIG. 3, to assemble the latching structure 100, the circuit board 20 is placed on the lower housing 10. The fixing poles 121 pass through the corresponding positioning slots 211 of the circuit board 20. The two locking slots 123 receive the two extending flanges 23. The upper housing 30 is placed on the circuit board 20. The fixing poles 121 pass through the two engaging holes 312 of the upper housing 30, and the distal end protrudes past both of the fixing poles 122. The two latching flanges 25 are latched into the two latching holes 331 of the upper housing 30. Referring further to FIG. 4, the exposed distal end of the fixing pole 121 can be softened or melted by heat, and the melted plastic may flow into and fill the conjoining holes 313 of the upper housing 30 for attachment. After that, the fixing poles 121 are cooled and subsequently secure the lower housing 10, the circuit board 20 and the upper housing 30 together.

It is to be understood that even though numerous characteristics and advantages of the present embodiments have been set forth in the foregoing description, together with details of structures and functions of various embodiments, the disclosure is illustrative only, and changes may be made in detail, especially in matters of shape, size, and arrangement of parts within the principles of the present invention to the full extent indicated by the broad general meaning of the terms in which the appended claims are expressed.

What is claimed is:

1. A latching structure of electronic device, comprising:
   a lower plastic housing forming at least one fixing pole;
   a circuit board defining at least one positioning slot corresponding to the fixing pole;
   a metal upper housing defining at least one engaging hole corresponding to the fixing pole, conjoining holes being defined at the periphery of each engaging hole and communicating with the engaging hole;
   wherein, the fixing pole passes through the positioning slot and the engaging hole, and after the distal end of the fixing pole is softened or melted by heat, the melted plastic flows into and fills the conjoining holes, the fixing poles are cooled and secure the lower housing with the circuit board and the upper housing, thereby clamping the circuit board between the lower housing and the upper housing.

2. The latching structure of electronic device as claimed in claim 1, wherein the lower housing forms at least one latching block, the latching block defines a locking slot, the circuit board forms at least one extending flange to engage into the locking slot.

3. The latching structure of electronic device as claimed in claim 2, wherein the upper housing forms at least one folding flange, the folding flange defines a latching hole, the circuit board forms at least one latching flange to latch into the latching hole.

4. The latching structure of electronic device as claimed in claim 3, wherein the circuit board includes a base, the extending flange and the latching flange are spaced and laterally extending at sides of the base.

5. The latching structure of electronic device as claimed in claim 2, wherein the lower housing includes a bottom wall, the fixing pole and the latching block protrudes from the bottom wall.

6. The latching structure of electronic device as claimed in claim 5, wherein the lower housing includes a peripheral wall surrounding the bottom wall and forming a receiving chamber, the receiving chamber receives the circuit board and the upper housing therein.

7. The latching structure of electronic device as claimed in claim 1, wherein the upper housing includes a main body, the folding flange is perpendicularly formed at the side of the main body.

8. A latching structure of electronic device, comprising:
a lower housing forming at least one fixing pole and at least one latching block, the latching block defining a locking slot;
a circuit board defining at least one positioning slot corresponding to the fixing pole, and forming at least one extending flange and at least one latching flange;
an upper housing defining at least one engaging hole corresponding to the fixing pole, and forming at least one folding flange, the folding flange defining a latching hole; wherein:
the fixing pole passes through the positioning slot and the engaging hole, and the distal end of the fixing pole is heated and then cooled to secure the lower housing with the circuit board and the upper housing, with the extending flange engaging into the locking slot, the latching flange latching into the latching hole, the circuit board is clamped between the lower housing and the upper housing.

9. The latching structure of electronic device as claimed in claim 8, wherein the lower housing includes a bottom wall, the fixing pole and the latching block protrudes from the bottom wall.

10. The latching structure of electronic device as claimed in claim 8, wherein the lower housing includes a peripheral wall surrounding the bottom wall and forming a receiving chamber, the receiving chamber receives the circuit board and the upper housing therein.

11. The latching structure of electronic device as claimed in claim 8, wherein the circuit board includes a base, the extending flange and the latching flange are spaced and laterally extending at sides of the base.

12. The latching structure of electronic device as claimed in claim 8, wherein the upper housing includes a main body, the folding flange is perpendicularly formed at the side of the main body.

13. The latching structure of electronic device as claimed in claim 8, wherein the engaging hole defines conjoining holes at the periphery, the conjoining holes communicate with the engaging hole.

* * * * *